(12) United States Patent
Wang

(10) Patent No.: US 6,963,492 B2
(45) Date of Patent: Nov. 8, 2005

(54) LOCKABLE RETRACTABLE LOCATING FRAME OF A BGA ON-TOP TEST SOCKET

(75) Inventor: D. Hung Wang, Hsin Tien (TW)

(73) Assignee: Via Technologies, Inc., Taipei Hsien (TW)

( * ) Notice: Subject to any disclaimer, the term of this patent is extended or adjusted under 35 U.S.C. 154(b) by 0 days.

(21) Appl. No.: 10/886,597

(22) Filed: Jul. 9, 2004

(65) Prior Publication Data
US 2005/0142901 A1 Jun. 30, 2005

(30) Foreign Application Priority Data
Jul. 11, 2003 (TW) ............................. 92119064 A

(51) Int. Cl.$^7$ ............................. H05K 7/10; H05K 7/12
(52) U.S. Cl. .................... 361/768; 361/760; 439/266; 324/754
(58) Field of Search ............................. 361/760–761, 361/768; 439/266–268, 71–73; 324/754–755; 257/727–730

(56) References Cited

U.S. PATENT DOCUMENTS

| | | | | |
|---|---|---|---|---|
| 5,470,247 A | * | 11/1995 | Fuchigami | ................. 439/264 |
| 5,482,471 A | * | 1/1996 | Mori et al. | ................. 439/263 |
| 5,800,194 A | * | 9/1998 | Yamagishi | ................. 439/266 |
| 6,042,409 A | * | 3/2000 | Ohshima | ................. 439/268 |
| 6,126,467 A | * | 10/2000 | Ohashi | ................. 439/268 |
| 6,402,537 B2 | * | 6/2002 | Ikeya | ................. 439/259 |
| 6,489,790 B1 | * | 12/2002 | An et al. | ................. 324/755 |
| 6,586,925 B2 | * | 7/2003 | Ramesh et al. | ........... 324/158.1 |
| 6,749,443 B2 | * | 6/2004 | Sano et al. | ................. 439/71 |

* cited by examiner

Primary Examiner—Randy Gibson
Assistant Examiner—Tuan Dinh
(74) Attorney, Agent, or Firm—Troxell Law Office, PLLC

(57) ABSTRACT

A lockable retractable locating frame of a BGA on-top test socket includes a push-and-lock mechanism that further comprises an accommodation room, a slider, and a sliding slot for riding the slider. The slider further includes a driving portion for receiving foreign input, a tongue portion nested in the accommodation room for protruding into a stroke space formed between the retractable locating frame and a base of the test socket, and a connection portion bridging the driving portion and the tongue portion for forming a slide pair with the sliding slot. By protruding the tongue portion into the stroke space to form a stop for avoiding movement of the retractable locating frame with respect to the base, the spacing between the base and the retractable locating frame can be thus kept and the electronic device mounted on the test socket can be secured.

4 Claims, 7 Drawing Sheets

LOCKABLE RETRACTABLE LOCATING FRAME OF A BGA ON-TOP TEST SOCKET

BACKGROUND OF THE INVENTION (1) Field of the Invention

The invention relates to a lockable retractable locating frame of a BGA (Ball grid array) on-top test socket, and more particularly to a controllable frame which utilizes a push-and-lock mechanism to block selectively downward movement of the frame and so as to freeze the position relationship between the frame and the base bearing the frame.

(2) Description of the Prior Art

In the industry of testing electronic devices, especially BGA-type electronic devices, an open-top test socket is usually utilized as an interface structure between devices under test (DUT) and the test circuiting. By providing the open-top test socket, advantages such as easy up-and-down loading of DUTs, adoptable to various packing thickness, and providing better environmental ventilation can be easily obtained.

Referring to FIG. 1, a conventional open-top test socket 20 is shown to be mounted on a test board 10 which includes the test circuiting for testing electronic devices. Also shown in the figure, a DUT 5 has already sit on the test socket 20.

Refer to both FIG. 1 and FIG. 2. The test socket 20 consists of a base 202 fixed on the test board 10, and a locating frame 201 mounted atop the base 202. The test socket 20 is shaped rectangular so as to provide an inside for constructing a ball-clipping mechanism 203. The ball-clipping mechanism 203 for positioning the DUT 5 further includes a fixed thumb set and a pairing movable forefinger set. Upon some particular arrangements, several stroke spaces 204 are formed between the base 202 and the locating frame 201. As shown in FIG. 2, those stroke spaces 204 may have different widths, but always have a common height S, the operational stroke of the test socket 20, which defines the maximum allowed distance for the locating frame 201 to move downward against the base 202.

Prior to mounting an electronic device 5 onto the ball-clipping mechanism 203 of the test socket 20, the locating frame 201 is firstly depressed evenly to move toward the base 202 along the operation stroke S such that the movable forefinger set of the ball-clipping mechanism 203 can be moved with respect to the fixed thumb set to produce predetermined spacing for receiving sparkle balls of the electronic device 5. As long as the electronic device 5 is set on the ball-clipping mechanism 203, the locating frame 201 is then released and moves automatically away the base 202 till the height S is regained. Simultaneously with the upward movement of the locating frame 201, the movable forefinger set is moved close to the fixed thumb set so as to clip each of the solder balls of the electronic device 5 in between and thus the electronic device 5 is held firmly on the test socket 20 by the ball-clipping mechanism 203.

On the other hand, while an electronic device 5 is downloaded from the test socket 20, the locating frame 201 is firstly depressed to regenerate the predetermined spacing between the fixed thumb set and the movable forefinger set of the ball-clipping mechanism 203. Thereby, the solder balls of the electronic device 5 can be released and removed from the test socket 20.

Obviously, by providing the test socket 20, the testing upon the electronic devices 5 with various package thickness, lead or ball numbers can no longer be a problem in the art.

Nevertheless, a requirement for successfully applying the test socket 20 mentioned above is that, during the testing, the locating frame 201 must be free of any forcing so as not to accidentally release the electronic device 5 under test. Referring to FIG. 3, a reason for the above requirement is that an unexpected forcing to the ball clipping mechanism 203 can shorten the distance S between the locating frame 201 and the base 202, such that a shift will be contributed to broaden the spacing between the fixed thumb set 2031 and the moveable forefinger set 2032 of the ball-clipping mechanism 203. As a consequence, the solder balls 51 of the DUT 5 held originally in position by the ball-clipping mechanism 203 will be instantly released and thereby make the DUT 5 flip up off the mechanism 203 to an incorrect position shown by the dashed DUT 5'. Definitely, in the position 5', the testing can never be performed correctly. In particular, it is noted that the minor shift of the DUT from the correct position 5 to the fault position 5' is usually negligible and can't be corrected in time.

Though the foregoing free-of-forcing requirement to the locating frame 201 may be prevented by a careful operator, yet some non-human factors, such as an unexpected shaking from the neighboring facilities, a pass-by vehicle, or an accidental impact nearby may also cause the locating frame 201 to shift and result in releasing the DUT 5 to an incorrect position. Apparently, aforesaid minor shift problem of the test socket 20 constructed as above can't be only eliminated by caution and thus is always a reason to question the testing outcome.

SUMMARY OF THE INVENTION

Accordingly, it is a primary object of the present invention to provide a lockable retractable locating frame of a BGA on-top test socket which introduces a push-and-lock mechanism capable of freezing the operational stroke S between the locating frame and the base of the test socket and thereby ensures the testing of the DUTs on the test socket.

The lockable retractable locating frame of a BGA on-top test socket in accordance with the present invention is located atop a base of the test socket and is spaced from the base with a plurality of stroke spaces that define an operational stroke between the fixed base and the movable locating frame. The locating frame further comprises at least a push-and-lock mechanism neighboring one of the stroke spaces. The push-and-lock mechanism of the present invention can further include an accommodation room, a sliding slot and a slider.

The accommodation room can be constructed inside the locating frame by having an opening connecting with the stroke space. Providing the accommodation room to the locating frame, a division wall thereof can be formed to separate the accommodation room and a lateral surface of the locating frame.

The sliding slot can be constructed at the division wall by cutting in and extending longitudinally to the stroke space. The sliding slot, establishing a connection in space between the accommodation room and the lateral surface as well as the exterior of the locating frame, is used as a track for the slider to travel.

The slider, movable along the sliding slot for protruding into the stroke space, can further include a driving portion, a tongue portion, and a connection portion bridging the driving portion and the tongue portion. The driving portion can be located outside the lateral surface of the locating frame and be used as an input end of the push-and-lock mechanism. The tongue portion can be nested in the accommodation room and can protrude partly into the stroke space through the opening while the slider is moved to do so. The connection portion, connecting the driving portion and the tongue portion through the division wall by penetrating the sliding slot, is constructed as a means for the slider to move along the sliding slot.

In the present invention, the push-and-lock mechanism of the locating frame can include a nest state and a protrusion state. While the push-and-lock mechanism is in the nest state, the tongue portion is completely accommodated inside the accommodation room. The protrusion state can be achieved by acting at the driving portion to move the slider a predetermined distance toward the stroke space along the sliding slot. While the push-and-lock mechanism is in the protrusion state, the tongue portion can provide a front end thereof to enter the stroke space and thus form a predetermined contact relationship with an upper surface of the base. Upon such an arrangement of the protrusion state, any movement of the locating frame toward the base can be prohibited and thus the minor shift problem of the test socket mentioned in the background section can be resolved.

In the present invention, to transform the push-and-lock mechanism from the protrusion state to the nest state, a forcing can be applied to the driving portion to retrieve the front end of the slider back to the accommodation room. Then, the stroke space is free of the slider and thus can allow the locating frame to displace with respect to the base.

In one embodiment of the present invention, the sliding slot of the push-and-lock mechanism of the locating frame can further include an extended tail cut at an end thereof away from the stroke space.

In one embodiment of the present invention, the sliding slot can be a saw-shaped cut at the division wall and thereby can form a plurality of stable positions there-along.

In one embodiment of the present invention, the lateral surface of the locating frame can further include a stop rail parallel substantially to the sliding slot for regulating the driving portion as well as the slider to move along a direction parallel to the sliding slot.

All these objects are achieved by the lockable retractable locating frame of a BGA on-top test socket described below.

BRIEF DESCRIPTION OF THE DRAWINGS

The present invention will now be specified with reference to its preferred embodiment illustrated in the drawings, in which.

DESCRIPTION OF THE PREFERRED EMBODIMENT

The invention disclosed herein is directed to a lockable retractable locating frame of a BGA on-top test socket. In the following description, numerous details are set forth in order to provide a thorough understanding of the present invention. It will be appreciated by one skilled in the art that variations of these specific details are possible while still achieving the results of the present invention. In other instance, well-known components are not described in detail in order not to unnecessarily obscure the present invention.

In the present invention, the lockable retractable locating frame of a BGA (Ball grid array) on-top test socket is introduced to provide a controllable push-and-lock mechanism for blocking selectively movement of the locating frame toward a base of the test socket, such that the holding of the sparkle balls of the electronic device mounted in the test socket can then be secured.

Figure 1:
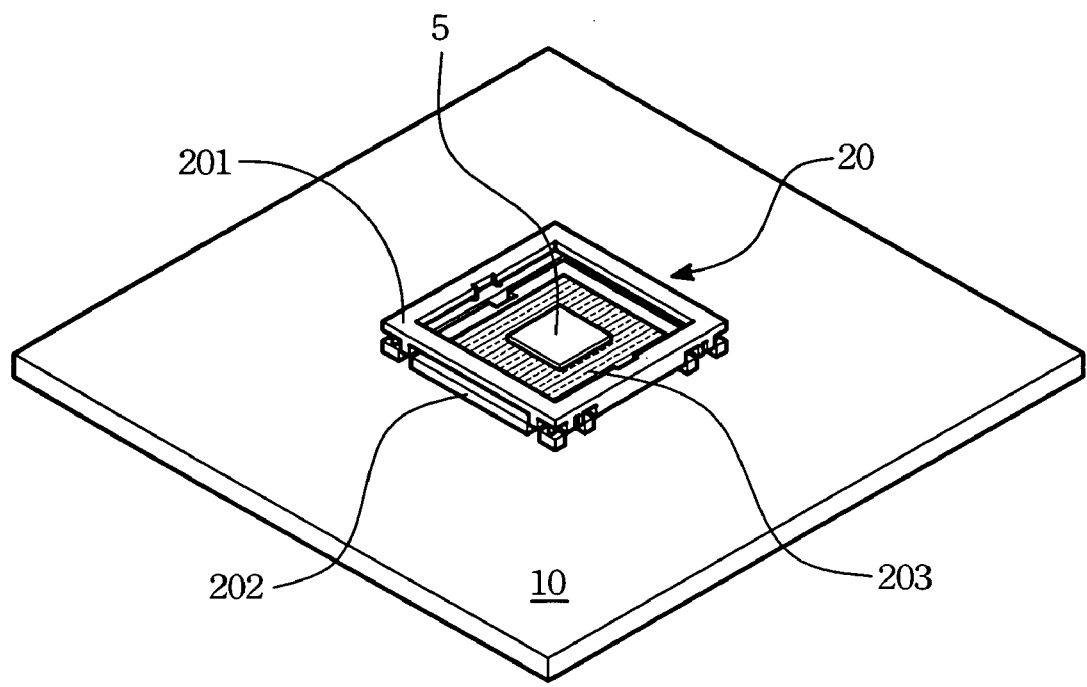
FIG. 1 is a perspective view showing an electronic device mounted on a conventional test socket.
Figure 2:
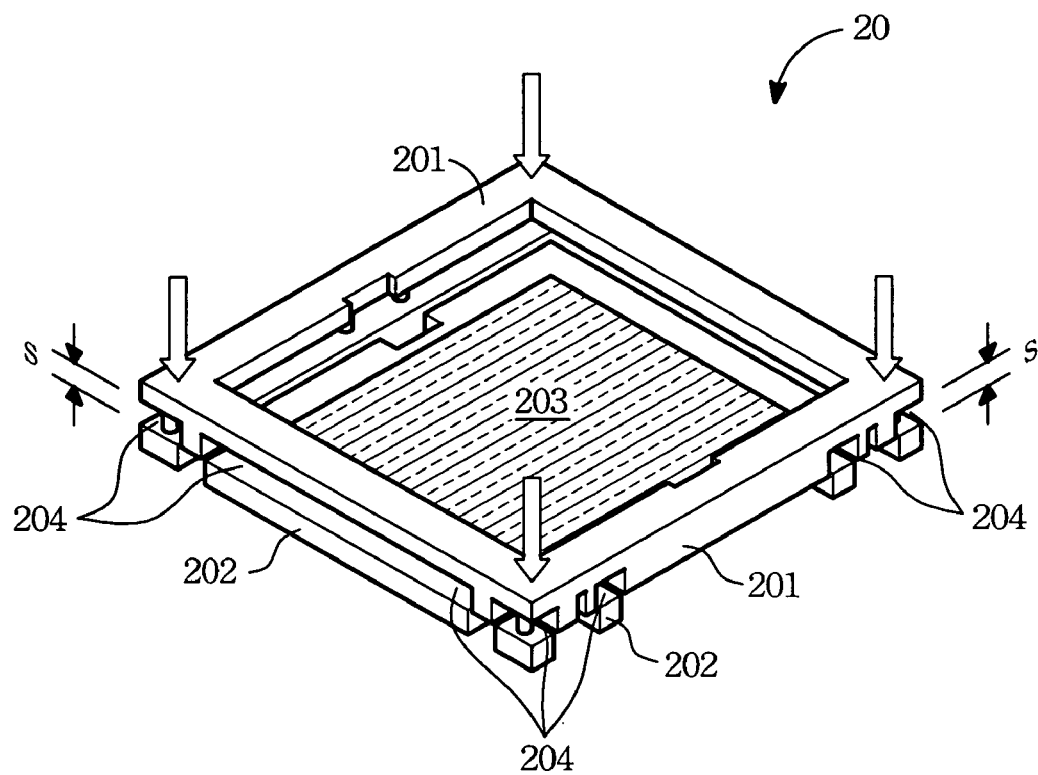
FIG. 2 is an enlarged perspective view of the test socket of FIG. 1.
Figure 3:
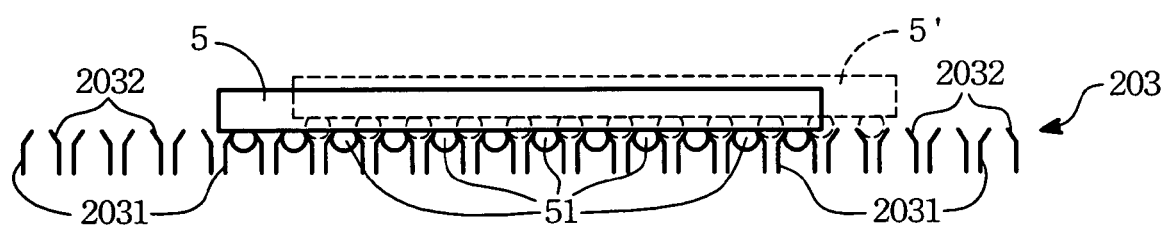
FIG. 3 is a schematic side view showing an electronic device rested on a ball-clipping mechanism of the test socket of FIG. 1.
Figure 4:
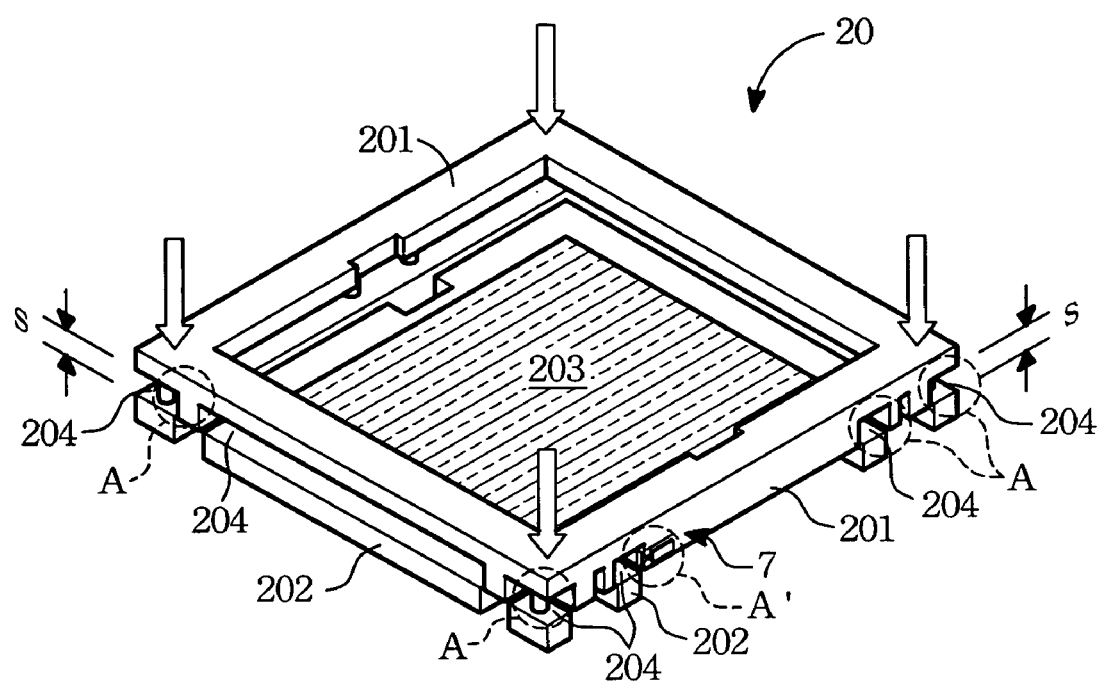
FIG. 4 is a perspective view of a preferred embodiment of the lockable retractable locating frame of a BGA on-top test socket in accordance with the present invention.

Referring now to FIG. 4, a preferred embodiment of the lockable retractable locating frame of the BGA on-top test socket 20 in accordance with the present invention is shown. As illustrated, the test socket 20 includes a base 202 and a locating frame 201 mounted atop the base 202. The test socket 20 is shaped rectangular so as to provide an inside for constructing a ball-clipping mechanism 203. In particular, several stroke spaces 204 are formed between the base 202 and the locating frame 201. As shown in FIG. 4, those stroke spaces 204 may have different widths, but always have a common height S for defining the operational stroke of the test socket 20, i.e. the maximum allowed distance for the locating frame 201 to travel toward the base 202. In the present invention, at least one of those stroke spaces 204 is selected to construct a push-and-lock mechanism for blocking the selected stroke space 204 so as to avoid any displacement between the locating frame 201 and the base 202. Thereby, the anchoring of the electronic device in the test socket 20 provided by the fixed thumb set and the movable forefinger set of the ball-clipping mechanism 203 can be ensured.

In the present invention, the mechanism for providing a "no-deformation" state between the locating frame 201 and the base 202 is defined as a push-and-lock mechanism which can be constructed at any placement of the test socket 20, either at the locating frame 201 or at the base 202, adjacent a specific stroke space 204. For example, as shown in FIG. 4, a plurality of areas, A and A', at the locating frame 201 can be selected to construct the push-and-lock mechanism 7 of the present invention. In particular in the embodiment of FIG. 4, the push-and-lock mechanism 7 is constructed at the area A'. It is noted that, in the embodiment, a single push-and-lock mechanism 7 is enough to provide the requirement of the invention in freezing the position relationship between the locating frame 201 and the base 202.

Figure 5:
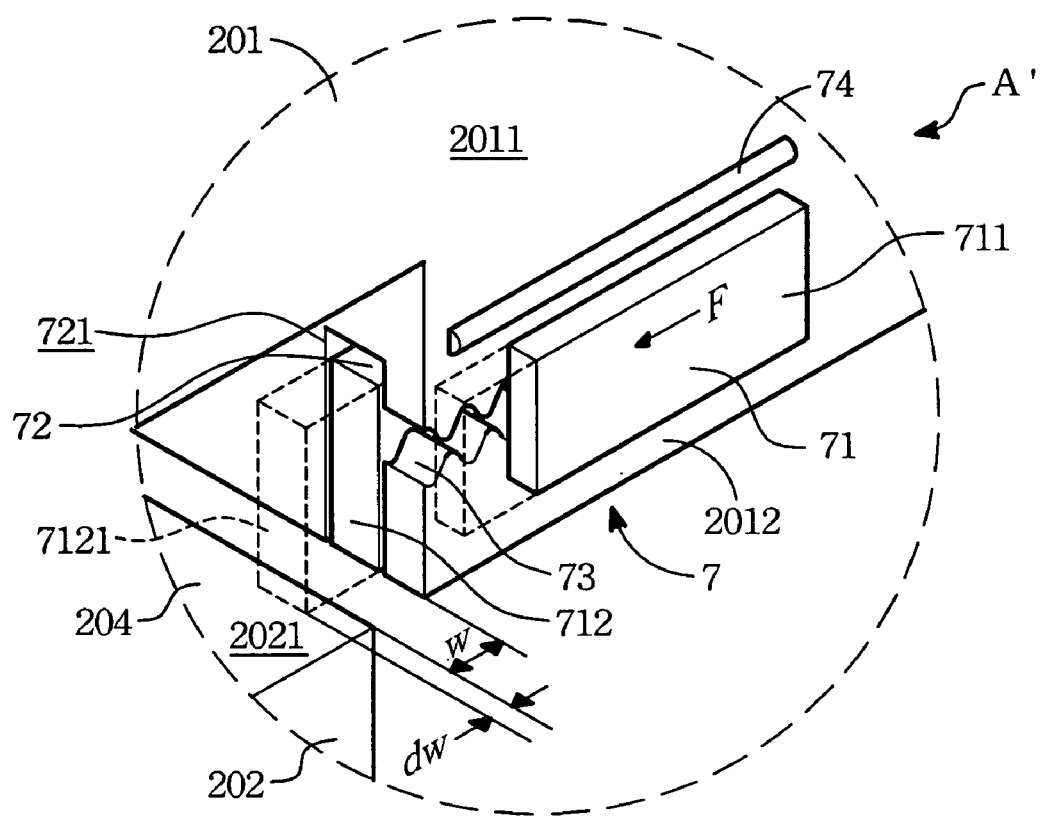
FIG. 5 is an enlarged perspective view of an area A' of FIG. 4.
Figure 6:
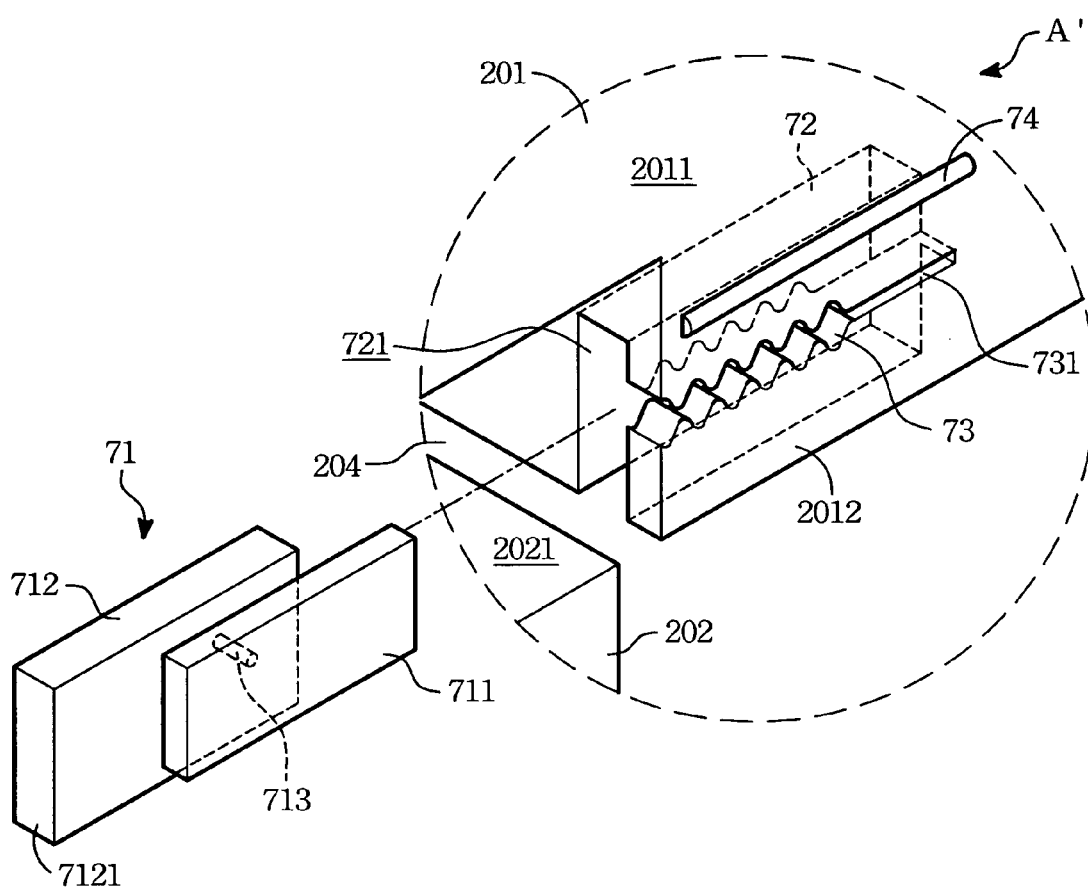
FIG. 6 is a perspective exploded view of a preferred push-and-lock mechanism in accordance with the present invention.

Referring now to FIG. 5 and FIG. 6, two enlargements upon area A' in FIG. 4 are used to illustrate the push-and-lock mechanism 7 of the present invention; one in an assembled form and another in an exploded form, respectively. In this embodiment, the push-and-lock mechanism 7 is located at a typical place of the locating frame 201 neighboring a specific stroke space 204. The push-and-lock mechanism 7 of the present invention can include an accommodation room 72, a sliding slot 73, and a slider 71 movable with respect to the accommodation room 72 and the sliding slot 73.

The accommodation room 72 of the push-and-lock mechanism 7 as shown is constructed inside the locating frame 201 by having an opening 721 connecting with the stroke space 204. By providing the accommodation room 72 to the locating frame 201, a division wall 2012 with a predetermined thickness thereof is formed to separate the accommodation room 72 and a lateral surface 2011 of the locating frame 201. The opening 721 of the accommodation room 72 is positioned to form a doorway for the a portion of the slider 71 to protrude into the neighboring stroke space 204.

The sliding slot 73 of the push-and-lock mechanism 7 is constructed at the division wall 2012 by cutting in and extending longitudinally to the stroke space 204. The sliding slot 73, establishing a connection in space between the accommodation room 72 and the lateral surface 2011 symbolizing the exterior of the locating frame 201, is used as a track for the slider 71 to travel. As shown, the sliding slot 73 of this embodiment is formed to be a saw-shaped cut at the division wall 2012 and thereby a plurality of stable positions along the sliding slot 73 for the slider 71 to anchor can be erected. In addition, the sliding slot 73 can further include an extended tail cut 731 at an end thereof away from the stroke space 204. By the geometrical relation provided by the tail cut 731 with respect to the division wall 2012, an equivalent cantilever beam at a lower portion of the division wall 2012 under the sliding slot 73 can thus be formed to enhance the over elasticity for the slider 71 to slide along the sliding slot 73.

The slider 71 of the push-and-lock mechanism 7 movable along the sliding slot 73 for protruding into the neighboring stroke space 204 can further include a driving portion 711, a tongue portion 712, and a connection portion 713 bridging the driving portion 711 and the tongue portion 712. The driving portion 711 is located outside the lateral surface 2011 of the locating frame 201 to be used as an input end of the push-and-lock mechanism 7. The tongue portion 712 is nested in the accommodation room 72 and can protrude partly into the stroke space 204 through the opening 721 while the slider 71 is moved to do so. The connection portion 713, connecting the driving portion 711 and the tongue portion 712 through the division wall 2012 by penetrating the sliding slot 73, is constructed as a means for the slider 71 to move along the sliding slot 73 by a back-and-forth pattern toward the neighboring stroke space 204. In particular, the connection portion 713 is shaped as a short pillar in this embodiment.

As shown in FIG. 5, the push-and-lock mechanism 7 of the locating frame 201 can include a nest state shown in solid lines and a protrusion state shown in dashed lines. While the push-and-lock mechanism 7 is in the nest state, the tongue portion 712 is completely accommodated inside the accommodation room 72. By exerting a force F directing to the stroke space 204 on the driving portion 711, the whole slider 71 can be moved along the sliding slot 73 a predetermined distance so as to send a front end 7121 of the tongue portion 712 into the stroke space 204 via the opening 721. The protrusion state can then be achieved as long as the tongue portion 712 forms a predetermined contact relationship with an upper surface 2021 of the base 202. Upon such an arrangement of the protrusion state of the push-and-lock mechanism 7, any movement of the locating frame 201 toward the base 202 can be prohibited and thus the minor shift problem of the test socket 20 mentioned in the background section can be resolved.

On the other hand, the state of the push-and-lock mechanism 7 can be changed from the protrusion state to the nest state by applying a force opposite to the F shown in FIG. 5 to push back the driving portion 711 such that the front end 7121 of the slider 71 can be retrieved away the stroke space 204 and totally back to the accommodation room 72. Then, the stroke space 204 is free of any obstacle, i.e. the slider 71, and thus can allow the locating frame 201 to be displaceable again with respect to the base 202.

In the embodiment shown in FIG. 5 and FIG. 6, a stop rail 74 parallel substantially to the sliding slot 73 can be included at the lateral surface 2011 of the locating frame 201 for regulating the driving portion 711 as well as the slider 71 to move along a direction parallel to the sliding slot 73.

Figure 7:
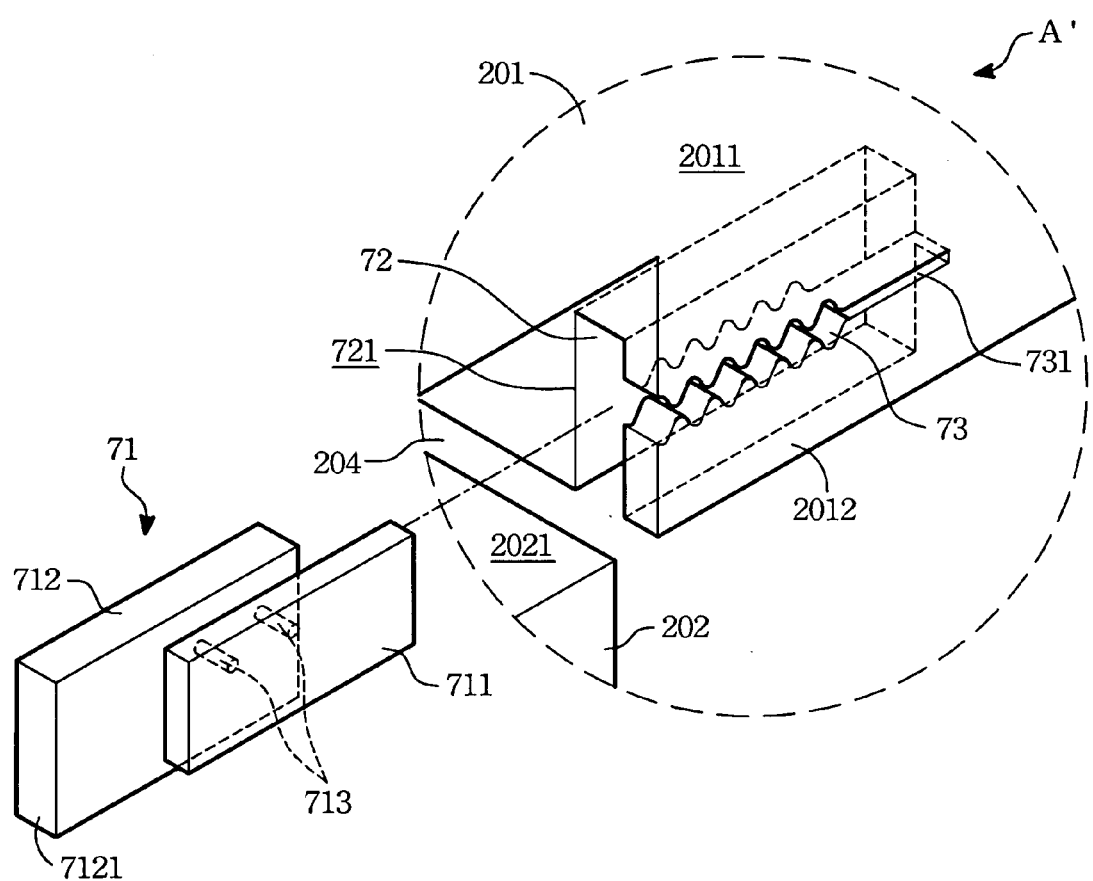
FIG. 7 is a perspective exploded view of another push-and-lock mechanism in accordance with the present invention.

Referring now to FIG. 7, another embodiment of the push-and-lock mechanism 7 in accordance with the present invention is shown. Compared with the embodiment shown in FIG. 6, this embodiment is characterized by the formation of the connection portion 713 of the slider 71. The connection portion 713 herein is consisted of two parallel pillars which each of them can pair movably with the sliding slot 73. Upon such an arrangement, the inclusion of the stop rail 74 in FIG. 5 or FIG. 6 can be waived.

In this present invention, the combination of the pillar-shaped connection portion 713 of the slider 71 and the saw-shaped sliding slot 73 can successfully provide a series of piecewise stable positions to the movement of the slider 71 along the sliding slot 73. Yet, in the art, some other pairing such as a dent-to-dent pair, a spring rib structure, or any the like can also be adopted to equivalently perform the function provided by the foregoing combination. However, all those substitutes can be obvious to the skill after knowing the description of the present invention provided above. Therefore, details toward those possible equivalent replacements are omitted herein.

By providing the push-and-lock mechanism 7 to the lockable retractable locating frame 201 of a BGA on-top test socket 20 in the present invention, the minor shift of the locating frame 201 against the base 202 can thereby be controlled and thus the testing of the DUTs on the test socket 20 can be ensured.

While the present invention has been particularly shown and described with reference to a preferred embodiment, it will be understood by those skilled in the art that various changes in form and detail may be without departing from the spirit and scope of the present invention.

I claim:

1. A lockable retractable locating frame of a BGA on-top test socket, atop a base of the test socket, spacing from the base with a plurality of stroke spaces for defining an operational stroke between the base and the locating frame, comprising at least a push-and-lock mechanism neighboring one of the stroke spaces, the push-and-lock mechanism further comprising:

an accommodation room, constructed inside the locating frame by having an opening connecting with the stroke space, spacing a lateral surface of the locating frame with a division wall;

a sliding slot, constructed at the division wall by extending longitudinally to the stroke space, connecting the accommodation room to the lateral surface; and a slider, movable on the sliding slot for protruding into the stroke space, further comprising;

a driving portion, located outside the lateral surface of the locating frame;

a tongue portion, nested in the accommodation room for protruding partly into the stroke space through the opening; and a connection portion, connecting the driving portion and the tongue portion through the division wall by penetrating the sliding slot, movable along the sliding slot;

wherein the push-and-lock mechanism includes a nest state and a protrusion state; while in the nest state, the tongue portion being completely accommodated inside the accommodation room; while in the protrusion state achieved by acting at the driving portion to move the slider a predetermined distance toward the stroke space along the sliding slot, the tongue portion having a front end thereof to locate inside the stroke space and forming a predetermined contact relationship with the base.

2. The lockable retractable locating frame of a BGA on-top test socket according to claim 1, wherein said sliding slot further includes an extended tail cut at an end thereof away from said stroke space.

3. The lockable retractable locating frame of a BGA on-top test socket according to claim 1, wherein said sliding slot is a saw-shaped cut at said division wall.

4. The lockable retractable locating frame of a BGA on-top test socket according to claim 1, wherein said lateral surface further includes a stop rail parallel to said sliding slot for regulating said driving portion to move in a direction parallel to said sliding slot.

* * * * *